(12) United States Patent
Chou et al.

(10) Patent No.: US 10,928,447 B2
(45) Date of Patent: Feb. 23, 2021

(54) BUILT-IN SELF TEST CIRCUIT FOR MEASURING PHASE NOISE OF A PHASE LOCKED LOOP

(71) Applicant: Taiwan Semiconductor Manufacturing Co., Ltd., Hsin-Chu (TW)

(72) Inventors: Mao-Hsuan Chou, Hsinchu County (TW); Ya-Tin Chang, Hsinchu (TW); Ruey-Bin Sheen, Taichung (TW); Chih-Hsien Chang, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/575,275

(22) Filed: Sep. 18, 2019

(65) Prior Publication Data

US 2020/0132764 A1 Apr. 30, 2020

Related U.S. Application Data

(60) Provisional application No. 62/753,202, filed on Oct. 31, 2018.

(51) Int. Cl.
*G01R 31/317* (2006.01)
*H03L 7/18* (2006.01)
*H03L 7/085* (2006.01)

(52) U.S. Cl.
CPC . *G01R 31/31724* (2013.01); *G01R 31/31709* (2013.01); *H03L 7/085* (2013.01); *H03L 7/18* (2013.01)

(58) Field of Classification Search
CPC combination set(s) only.
See application file for complete search history.

(56) References Cited

U.S. PATENT DOCUMENTS 8,390,349 B1 * 3/2013 Ravi ..................... G04F 10/005
327/156
8,427,205 B1 4/2013 Nagaraj et al.
(Continued)

FOREIGN PATENT DOCUMENTS

CN 102210102 A 10/2011
CN 105071799 A 11/2015
(Continued)

OTHER PUBLICATIONS

Notice of Co-Pending Application(s) entitled "Method and Apparatus For Precision Phase Skew Generation".

*Primary Examiner* — Adam D Houston
(74) *Attorney, Agent, or Firm* — Duane Morris LLP

(57) ABSTRACT

An apparatus and method for providing a phase noise built-in self test (BIST) circuit are disclosed herein. In some embodiments, a method and apparatus for forming a multi-stage noise shaping (MASH) type high-order delta sigma (ΔΣ) time-to-digital converter (TDC) are disclosed. In some embodiments, an apparatus includes a plurality of first-order ΔΣ TDCs formed in an integrated circuit (IC) chip, wherein each of the first-order ΔΣ TDCs are connected to one another in a MASH type configuration to provide the MASH type high-order ΔΣ TDC, wherein the MASH type high-order ΔΣ TDC is configured to measure the phase noise of a device under text (DUT).

20 Claims, 7 Drawing Sheets

(56) References Cited

U.S. PATENT DOCUMENTS

| | | | |
|---|---|---|---|
| 8,773,182 B1* | 7/2014 | Degani | H03L 7/085 |
| | | | 327/156 |
| 9,705,515 B1* | 7/2017 | Lee | H03L 7/183 |
| 10,523,218 B2 | 12/2019 | Kuan et al. | |
| 2002/0036525 A1 | 3/2002 | Hwang | |
| 2003/0133522 A1* | 7/2003 | Staszewski | H03L 7/0991 |
| | | | 375/345 |
| 2007/0216489 A1 | 9/2007 | Krishnan et al. | |
| 2009/0219187 A1* | 9/2009 | Sun | G04F 10/005 |
| | | | 341/166 |
| 2010/0117700 A1 | 5/2010 | Raghunathan | |
| 2012/0049914 A1* | 3/2012 | Pellerano | H03L 7/1974 |
| | | | 327/158 |
| 2012/0319749 A1* | 12/2012 | Thaller | H03L 7/183 |
| | | | 327/158 |
| 2013/0223564 A1* | 8/2013 | Mayer | H04L 25/02 |
| | | | 375/296 |
| 2014/0266848 A1* | 9/2014 | Henzler | G04F 10/005 |
| | | | 341/166 |
| 2016/0056827 A1* | 2/2016 | Vlachogiannakis | H03B 5/1296 |
| | | | 327/158 |
| 2017/0329284 A1* | 11/2017 | Wu | H03M 3/414 |
| 2018/0181077 A1* | 6/2018 | Salle | H03L 7/085 |
| 2019/0007055 A1* | 1/2019 | Nelson | H03L 7/0807 |
| 2019/0068205 A1* | 2/2019 | Tamura | H03L 7/0995 |
| 2019/0199361 A1* | 6/2019 | Sudalaiyandi | H03K 5/131 |
| 2019/0280649 A1* | 9/2019 | Janardhanan | H03L 7/104 |
| 2019/0384230 A1* | 12/2019 | Dgani | G04F 10/005 |
| 2020/0076439 A1* | 3/2020 | Weeks | H03L 7/0805 |
| 2020/0132764 A1* | 4/2020 | Chou | H03L 7/18 |
| 2020/0174427 A1* | 6/2020 | Fujimoto | G04F 10/005 |
| 2020/0192301 A1* | 6/2020 | Khoury | H03L 7/085 |
| 2020/0195263 A1* | 6/2020 | Khoury | H03L 7/16 |

FOREIGN PATENT DOCUMENTS

| | | |
|---|---|---|
| TW | 200733566 A | 9/2007 |
| TW | 201414208 A | 4/2014 |
| TW | 201832039 A | 9/2018 |

* cited by examiner

BUILT-IN SELF TEST CIRCUIT FOR MEASURING PHASE NOISE OF A PHASE LOCKED LOOP

RELATED APPLICATIONS

This application claims priority to provisional application No. 62/753,202 entitled "Built-In Self Test Circuit for Measuring Phase Noise of a Phase Locked Loop," and filed on Oct. 31, 2018, the entirety of which is incorporated by reference herein.

BACKGROUND

Current methods of measuring phase noise are costly and complex. High speed probes for phase-locked loop (PLL) jitter measurement, for example, are expensive and the probes suffer from contact issues at high temperatures. On the other hand, a phase noise built-in self test (BIST) circuit may be able to detect the on-chip PLL jitter performance information and convert it to a low frequency digital signal.

Current methods to measure phase-locked loop (PLL) in-band phase noise utilize $2^{nd}$-order delta sigma ($\Delta\Sigma$) time-to-digital converters (TDC). One feature of $\Delta\Sigma$ converters or modulators is that they can shape the quantization noise to higher frequencies that reflect the low frequency input noise. Current TDC structures utilize cascade type continuous time $2^{nd}$ order $\Delta\Sigma$ modulators. However, high order continuous time $\Delta\Sigma$ modulators suffer from stability issues. In order to avoid stability issues, current TDC structures increase the clock rate up to 340 MHz, for example, for the PLL and built-in self test (BIST). However, a high frequency input clock is not suitable for general PLL applications. Therefore, current methods for measuring PLL in-band phase noise are not entirely satisfactory.

The information disclosed in this Background section is intended only to provide context for various embodiments of the invention described below and, therefore, this Background section may include information that is not necessarily prior art information (i.e., information that is already known to a person of ordinary skill in the art). Thus, work of the presently named inventors, to the extent the work is described in this background section, as well as aspects of the description that may not otherwise qualify as prior art at the time of filing, are neither expressly nor impliedly admitted as prior art against the present disclosure.

BRIEF DESCRIPTION OF THE DRAWINGS

Various exemplary embodiments of the present disclosure are described in detail below with reference to the following Figures. The drawings are provided for purposes of illustration only and merely depict exemplary embodiments of the present disclosure to facilitate the reader's understanding of the present disclosure. Therefore, the drawings should not be considered limiting of the breadth, scope, or applicability of the present disclosure. It should be noted that for clarity and ease of illustration these drawings are not necessarily drawn to scale.

DETAIL DESCRIPTION

Various exemplary embodiments of the present disclosure are described below with reference to the accompanying figures to enable a person of ordinary skill in the art to make and use the present disclosure. As would be apparent to those of ordinary skill in the art, after reading the present disclosure, various changes or modifications to the examples described herein can be made without departing from the scope of the present disclosure. Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

Figure 1:
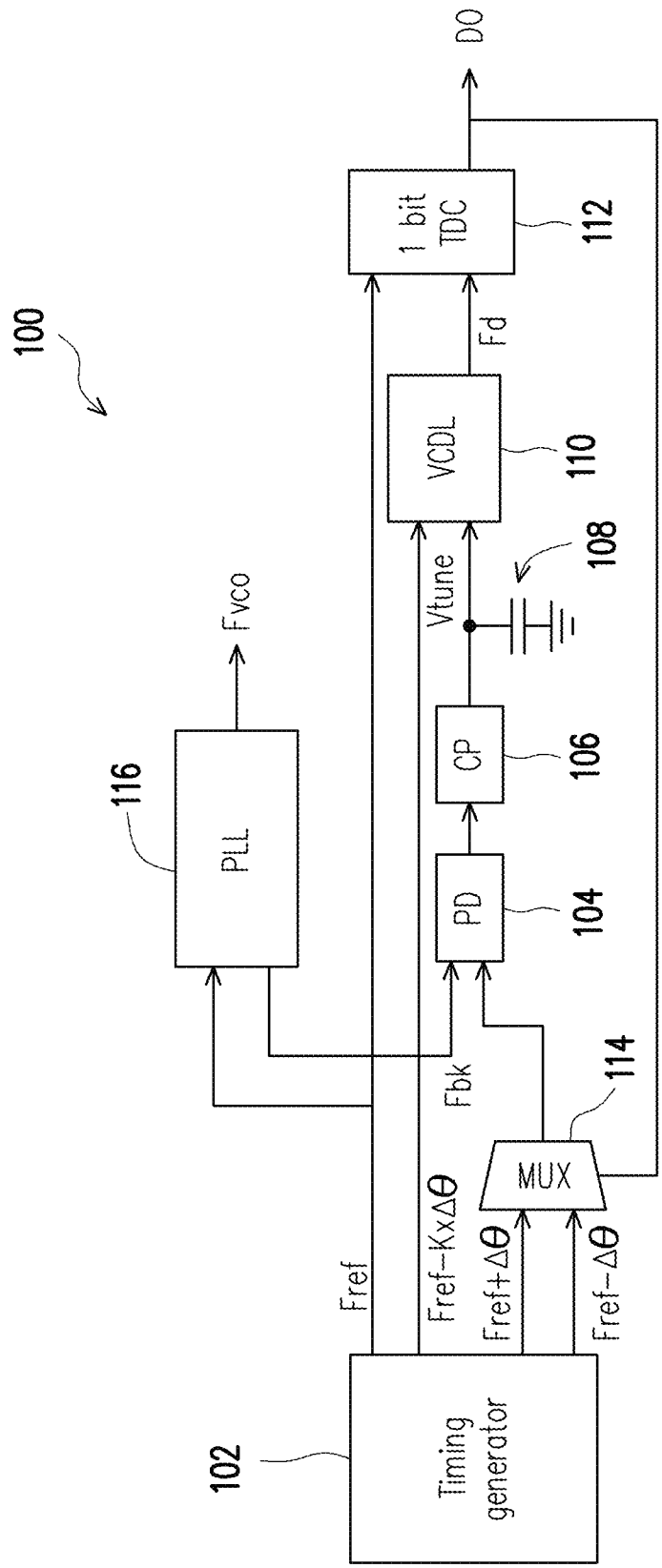
FIG. 1 illustrates a block diagram of a first-order $\Delta\Sigma$ TDC for on-chip PLL phase noise BIST, in accordance with some embodiments of the present disclosure.

FIG. 1 illustrates a block diagram of a first-order time domain $\Delta\Sigma$ TDC 100 that detects an input phase difference in time domain and converts the phase difference into a digital signal (e.g., a logical 0 or 1), in accordance with some embodiments. The $\Delta\Sigma$ 100 includes a timing generator 102, a phase detector 104, a charge pump 106, a filter (capacitor) 108, a voltage-controlled delay line (VCDL) 110, a one-bit TDC 112 and a multiplexer 114. The $\Delta\Sigma$ TDC 100 measures the phase noise of a PLL 116, which is the device under test (DUT) in the example illustrated in FIG. 1.

The timing generator 102 provides a reference frequency signal (Fref) and various precision offsets ($\Delta\theta$) from Fref, also referred to herein as phase skews. In some embodiments, the timing generator 102 provides Fref to a first input of the 1-bit TDC 112, a first phase offset signal Fref−$\Delta\theta$ to a first input of the MUX 114, a second phase offset signal Fref+$\Delta\theta$ to a second input of the MUX 114, and a third phase offset signal Fref−K$\Delta\theta$ is input to the VCDL 110. In some embodiments, K is an integer greater than or equal to 2 and is programmable. In some embodiments, the timing generator 102 is a precision phase skew generator as described in co-pending U.S. application Ser. No. 16/436,761 entitled "Method and Apparatus for Precision Phase Skew Generation," and filed on Jun. 10, 2019, the entirety of which is incorporated by reference herein.

The phase detector 104 detects an input phase error ($\Delta\theta'$) between a feedback signal (Fbk) from the PLL 116 and an output of the MUX 114. When the PLL 116 is in a locked state, the phases of Fref and Fbk are the same. The output of the MUX 114 can be either Fref+$\Delta\theta$ or Fref-$\Delta\theta$, where $\Delta\theta$ is the phase skew generated by the timing generator 102. It should be noted that $\Delta\theta'=\Delta\theta$+phase jitter. If Fbk is ideal and there is no phase jitter, then $\Delta\theta'=\Delta\theta$. The phase error ($\Delta\theta'$) between Fbk and the output of MUX 114 is then provided to the charge pump 106, which generates a current (Icp) based on the phase error and then provides Icp to the capacitor 108. The charge pump 106 and capacitor 108 perform an integration function to convert $\Delta\theta'$ to a voltage (Vtune) proportional to the phase error, which is then provided to a first input of the VCDL 110. In some embodiments, Vtune=($\Delta\theta'\times$Icp)/C, where C is capacitance of the capacitor 108. A second input of the VCDL 110 receives the signal Fref-K×$\Delta\theta$ provided from the timing generator 102. Here, K is determined based on how much the VCDL 110 input phase leads the phase of Fref, and also reflects the number of input stages of the VCDL 110. In some embodiments, K is determined to ensure that the VCDL 110 input (Fref-K×$\Delta\theta$) leads Fref to reserve enough timing margin for VCDL 110 delay ($\Delta T$). In some embodiments, K×$\Delta\theta$ is close to the value of the VCDL 110 delay in the $\Delta\Sigma$ TDC 100 (i.e., $\Delta T$). Based on Vtune and Fref-K×$\Delta\theta$ as inputs, the VCDL converts the voltage variation to a delay time ($\Delta T$) which is represented by an output signal Fd. Since Fref-K×$\Delta\theta$ always leads Fref, wherein K is an integer greater than 1, a sufficient timing margin for the VCDL 110 delay time ($\Delta T$) can be ensured. In various embodiments, depending on the structure of the VCDL, $\Delta T$ can be proportional or inversely proportional to the magnitude of Vtune. In some embodiments, $\Delta\theta$ is set to ensure that it is larger than the PLL jitter. For example, if the PLL jitter is about 10 picoseconds (ps), then the $\Delta\theta$ is set to be 30-50 ps.

In some embodiments, $\Delta T=Vtune\times K_{VCDL}$, where $K_{VCDL}$ is the gain of VCDL 110. Thus, $K_{VCDL}=\Delta T/\Delta Vtune$ (ps/V). Since Vtune is proportional to the VCDL current, a larger VCDL current means there is a shorter delay. Also, since Vtune is an analog signal, it adjusts the VCDL overall delay time $\Delta T$, where $\Delta T$ is the overall delay time from the VCDL input (Fref-K×$\Delta\theta$) to the VCDL output (Fd). Thus, different values of Vtune causes the VCDL 110 to have different delay times $\Delta T$. If $\Delta T<K\times\Delta\theta$, then Fd leads Fref, and the TDC 112 output will become high ("1"). On the other hand, if $\Delta T>K\times\Delta\theta$, then Fd lags Fref, and the TDC 112 output will become low ("0"). In some embodiments, the following steps are implemented to define each parameter: (step 1) define $\Delta\theta$ such that it is larger than the PLL jitter; (step 2) define the charge pump current (Icp) and capacitor 106 capacitance value (C); (step 3) calculate Kvcdl according to loop gain equation Kvcdl=C/Icp; and (step 4) design the VCDL 110 circuit to meet Kvcdl design specifications by checking VCDL delay time ($\Delta T$) when Vtune=0.5 VDD, where Vtune is in the range of 0.0 V to VDD. In accordance with some embodiments, the value of Icp is in the range of 1 µA to 200 µA, and the value of C is in the range of 0.1 pF to 10 pF.

The output of the VCDL 110 (Fd) is provided as a first input to the 1-bit TDC 112. Fref from the timing generator 102 is provided as a second input to the 1-bit TDC 112. The 1-bit TDC functions like a comparator in the time domain to compare the timing difference between Fd and Fref. In some embodiments, the 1-bit TDC includes a D flip-flop wherein the Fd signal is input to the D input of the flip flop and the Fref signal is input to the clock input of the flip flop, to provide a 1 bit (TDC) quantizer. Thus, the 1-bit TDC 112 detects the early/late information between the reference clock (Fref) and VCDL output (Fd). In some embodiments, when Fd leads Fref, the output of the 1-bit TDC 112 is a logical 1, and when Fd lags Fref, the output is a logical 0, for example. Since Fd will lead or lag Fref due to PLL 116 jitter, the digital output of the 1-bit TDC is representative of the PLL 116 jitter (i.e., phase noise). In some embodiments, the 1-bit TDC 112 outputs a digital value at each cycle of the input reference clock Fref. In some embodiments, the clock rate of the PLL 116, the VCDL 110 and the 1-bit TDC 112 is the same as the input reference clock Fref.

As shown in FIG. 1, the output of the 1-bit TDC 112 is provided as a control signal to the MUX 114. Based on the output value (0 or 1), the MUX 114 will provide either its first input signal (Fref+$\Delta\theta$) or its second input signal (Fref-$\Delta\theta$) as its output to the phase detector 104. Thereafter, the process described above repeats. Thus, as discussed above, the 1-bit TDC 112 generates a series of 1's and 0's at a frequency of Fref to provide digital data that is representative of phase noise information. In some embodiments, Fref and Fbk are both equal to the output frequency of the PLL 116 (Fvco) divided by N, where N is a positive integer greater than 1. For example, if Fvco=10 GHz and N=100, then Fref and Fbk=100 MHz, in accordance with some embodiments. In some embodiments, the Fvco noise=Fbk noise+20 log N. Thus, the Fvco noise can be measured or estimated by measuring the Fbk noise at a much lower frequency, which is much easier to measure.

Figure 2:
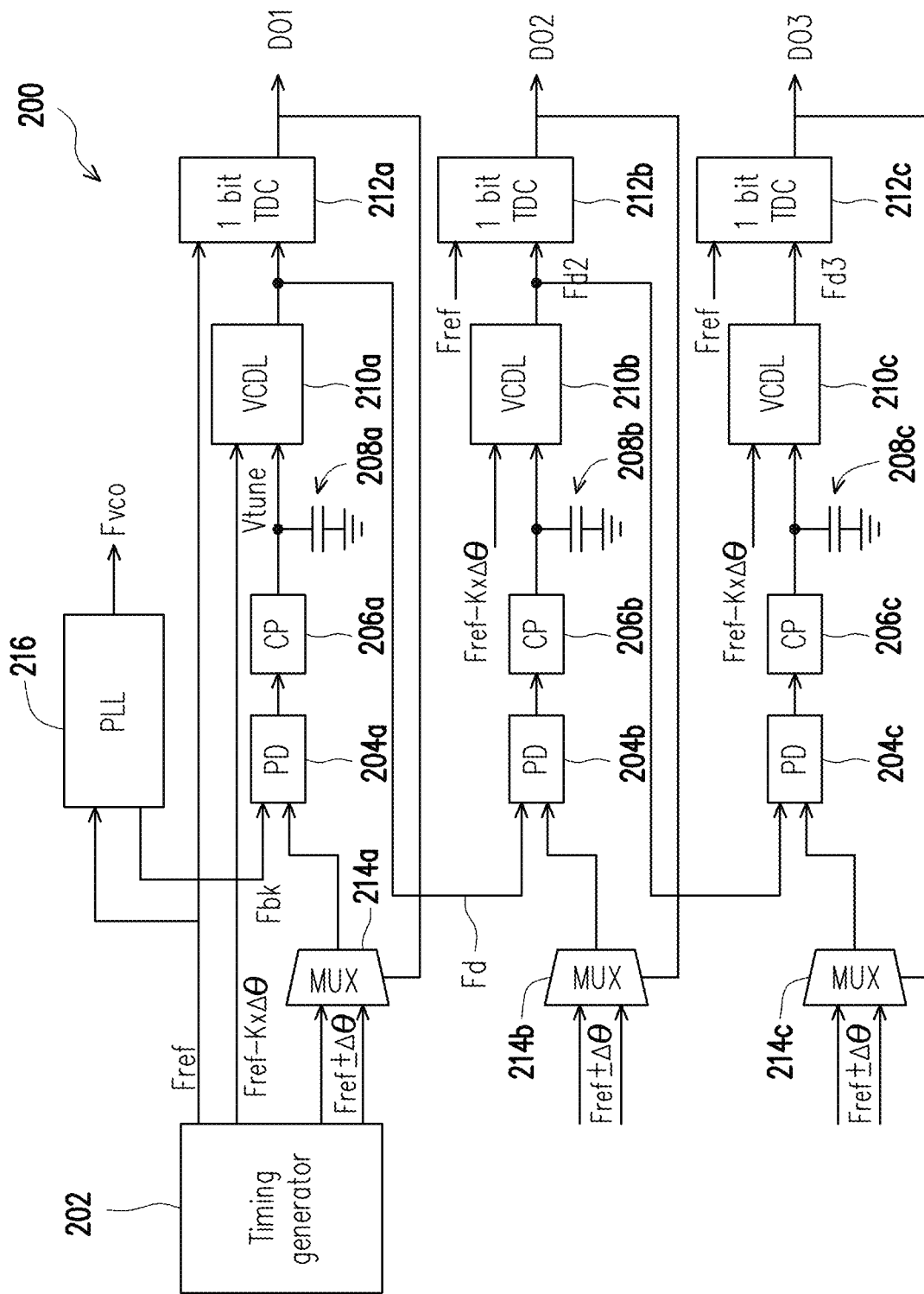
FIG. 2 illustrates a block diagram of a third-order $\Delta\Sigma$ TDC for on-chip PLL phase noise BIST, in accordance with some embodiments of the present disclosure.

FIG. 2 illustrates a block diagram of a Multi-stAge noise SHaping ("MASH") type 1-1-1 type third-order $\Delta\Sigma$TDC 200, in accordance with further embodiments of the invention. As shown in FIG. 2, the MASH type third-order $\Delta\Sigma$TDC 200 includes three first-order $\Delta\Sigma$ TDC's 100 (FIG. 1) connected to one another in a cascaded fashion to perform third-order MASH 1-1-1 $\Delta\Sigma$ TDC conversions. Each of the first-order $\Delta\Sigma\Sigma$TDC's 100 includes a respective phase detector 204a, 204b and 204c, a respective charge pump 206a, 206b and 206c, a respective capacitor 208a, 208b and 208c, a respective VCDL 210a, 210b and 210c, and a respective 1-bit TDC 212a, 212b and 212c. The function and operation of these respective circuits or modules are substantially similar to their counterparts described above with respect to FIG. 1. Therefore, a discussion of their respective functions is not repeated here.

Similar to the first-order $\Delta\Sigma$ TDC 100 of FIG. 1, a timing generator 202 outputs four signals: Fref, Fref-K×$\Delta\theta$, Fref+$\Delta\theta$ and Fref-$\Delta\theta$. Fref is provided as an input to the PLL 216 (DUT) and as a first input to the 1-bit TDC 212a. Fref-K×$\Delta\theta$ is provided as first input to each of the VCDLs 210a, 210b and 210c. Fref+$\Delta\theta$ and Fref-$\Delta\theta$ are each provided to respective first and second inputs of each of the MUXs 214a, 214b and 214c. The outputs of each of MUXs 214a, 214b and 214c are provided as a first input to each phase detector 204a, 204b and 204c, respectively. A feedback signal (Fbk) from the PLL 216 is provided as a second input to the first phase detector 204a. The output of the first VCDL 210a (Fd), also referred to herein as a residue value of the first first-order $\Delta\Sigma$ TDC, is provided as a second input to the first 1-bit TDC 212a and as a second input to the second phase detector 204b. The output of the second VCDL 210b (Fd2), also referred to herein as a residue value of the second first-order $\Delta\Sigma$ TDC, is provided as a second input to the second 1-bit TDC 212*b* and as a second input to the third phase detector 204*c*. The output of the third VCDL 210*c* (Fd3), also referred to herein as a residue value of the third first-order ΔΣ TDC, is provided as a second input to the third 1-bit TDC 212*c*.

Each of the 1-bit TDCs 212*a*, 212*b* and 212*c* outputs a respective digital signal D0, D1 and D2, which is fed back as a control signal to respective MUXs 214*a*, 214*b* and 214*c* to control the output of each MUX that is provided to respective phase detectors 204*a*, 204*b* and 204*c*. The remaining connections between respective phase detectors 204*a*, 204*b* and 204*c*, respective charge pumps 206*a*, 206*b* and 206*c*, respective capacitors 208*a*, 208*b* and 208*c*, and respective VCDLs 210*a*, 210*b* and 210*c* are the same as described above with respect to FIG. 1 and, therefore, their description is not repeated here.

Furthermore, each 1-bit TDC 212*a*, 212*b* and 212*c* outputs a respective digital output DO1, DO2 and DO3 at each cycle of the reference clock (Fref). Since the VCDL clock rates and reference clock (Fref) are the same, it is possible to record the quantization error (residue) of a previous stage 1-bit ΔΣ TDC and deliver it to next stage 1-bit ΔΣ TDC. One advantage of this architecture is that it provides a high order MASH type ΔΣ modulator without stability issues. Higher order architectures can also be provided by cascading another first-order 1-bit ΔΣ TDC in similar fashion to provide a fourth-order ΔΣ TDC, and so on. Conversely, a second-order MASH type ΔΣ TDC can be provided by cascading only two first-order 1-bit ΔΣ TDCs, instead of three as shown in FIG. 2. Furthermore, since the circuit structures of each stage's 1-bit Δθ TDC are the same, the design/layout of an on-chip BIST high-order MASH type Δθ TDC can be efficiently implemented.

Figure 3A:
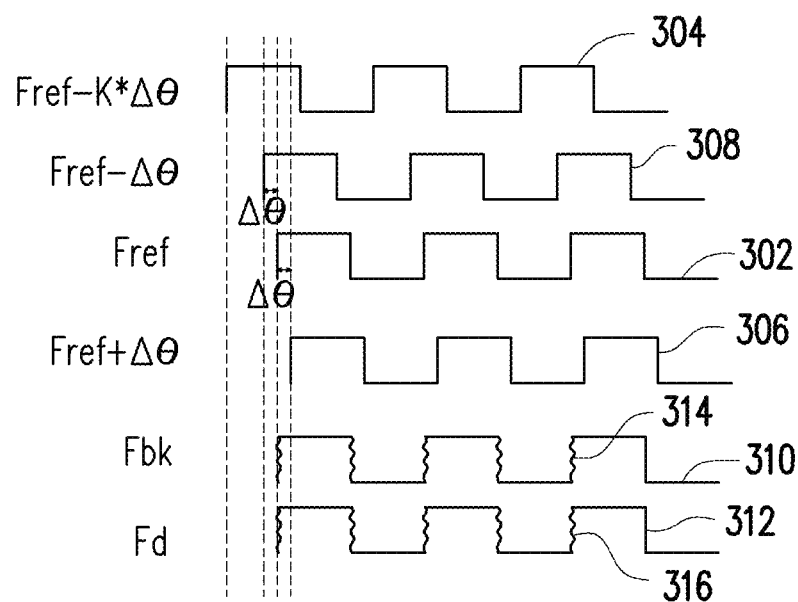
FIG. 3A illustrates a timing diagram of signals output by the timing generator 202 of FIG. 2 and an output Fd of the VCDL 210a of FIG. 2 and the feedback signal Fbk of the PLL 216 of FIG. 2.
Figure 3B:
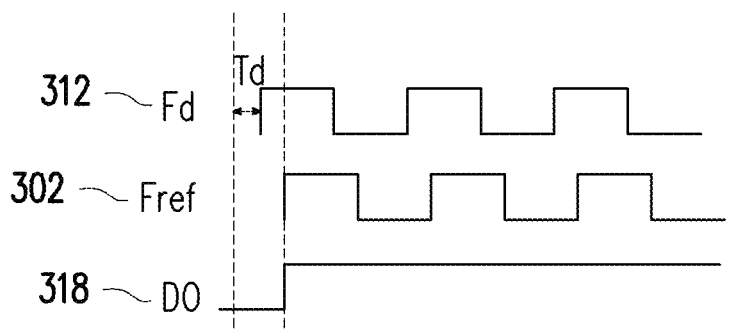
FIG. 3B illustrates a timing diagram showing when Fd leads Fref the output of the 1-bit TDC 212a goes high.
Figure 3C:
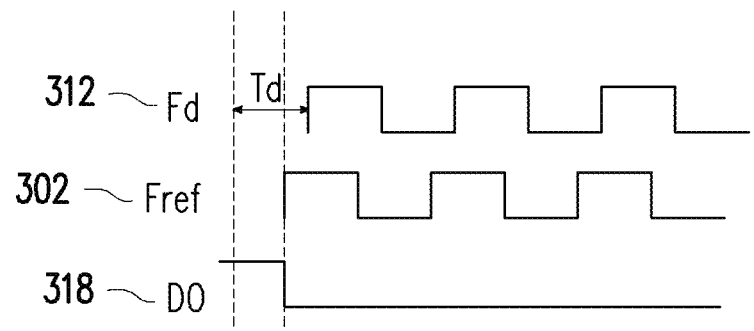
FIG. 3C illustrates a timing diagram showing when Fd lags Fref the output of the 1-bit TDC 212a goes low.

FIG. 3A illustrates a timing diagram for signals Fref 302, Fref−K×Δθ 304, Fref+Δθ 306 and Fref−Δθ 308, which are output by the timing generator 202, and Fbk 310 output by the PLL 216, and Fd 312 output by the VCDL 210. As shown in FIG. 3A, Fbk 310 includes PLL phase noise or jitter 314, which in turn results in phase noise or jitter 316 in the Fd 312 output by the VCDL 210. As shown in FIG. 3B, when Fd 312 leads Fref 302 in phase, the output D0 of the 1-bit TDC goes to a logic level high (i.e., 1). Conversely, as shown in FIG. 3B, when Fd 312 lags Fref 302 in phase, the output D0 goes to a logic level low (i.e., 0). In this way, a large set (e.g., $2^{16}$) of data values (1's and 0's) can be generated that is representative of the phase noise of the PLL 216.

Figure 4A:
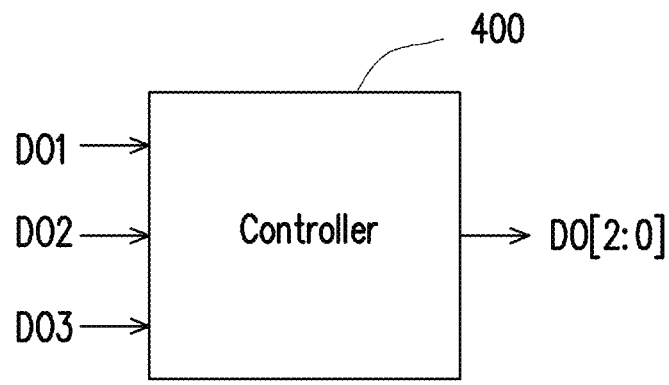
FIG. 4A illustrates a block diagram of a controller for receiving and processing the digital outputs of the third-order $\Delta\Sigma$ TDC of FIG. 2, in accordance with some embodiments.

As referred to herein, the terms "high-order" and "higher-order" means second order or higher. Referring to FIG. 4A, in some embodiments, the outputs of a higher order MASH type ΔΣ TDC (e.g., DO1, DO2, DO3, etc.) can be provided to controller 400. In some embodiments, the controller 300 merges or sums the digital outputs DO1, DO2 and DO3 to provide a combined output DO [2:0], for example, that is a more accurate representation of the PLL phase noise than each output alone. In some embodiments, the controller 400 can further perform a fast fourier transformation (FFT) on the digital outputs.

Figure 4B:
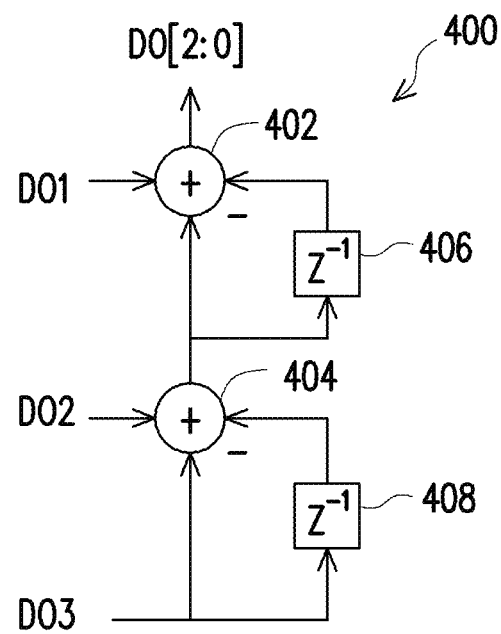
FIG. 4B illustrates a schematic diagram of the controller of FIG. 4A, in accordance with some embodiments.

Referring to FIG. 4B, in some embodiments, the controller 400 comprises a higher order delta sigma (ΔΣ) modulator 400 utilizing one or more adders, as known in the art. In some embodiments, the higher order ΔΣ modulator 400 is a third order ΔΣ modulator 400 having a first adder 402, a second adder 404, a first $Z^{-1}$ function module 406 and a second $Z^{-1}$ function module 408. In some embodiments, the $Z^{-1}$ function module provide a unit delay and can be implemented by a simple flip-flop. DO1, DO2 and DO3 are each digital signals, and the data rate is the same as Fref from the ΔΣ TDC 100. In some embodiments, simple flip-flops and Fref are used as the sampling clock to achieve the unit delay functions of the $Z^{-1}$ function modules 406 and 408.

As shown in FIG. 3B, the first digital output DO1 is provided as an input to the first adder 402. The second digital output DO2 is provided as an input to the second adder 404, and the third digital output DO3 is provided as an input to the second adder 404 and the second $Z^{-1}$ function module 408. A negative output of the second $Z^{-1}$ function module 408 is also provided as an input to the second adder 404. In other words, the output of the second $Z^{-1}$ function module 408 is subtracted by the second adder 404. An output of the second adder 404 is also provided as an input to the first adder 402 and the first $Z^{-1}$ function module 406. A negative output of the first $Z^{-1}$ function module 406 is also provided as an input to the first adder 402, which provides the combined digital output DO[2:0] of the controller 400 that is representative of the PLL 216 phase noise. In some embodiments, the controller 400 includes further circuitry for performing FFT functions on the output DO[2:0] or, alternatively, provides the digital output to another circuit or module for performing FFT functions and/or other desired processing on the data.

Figure 5:
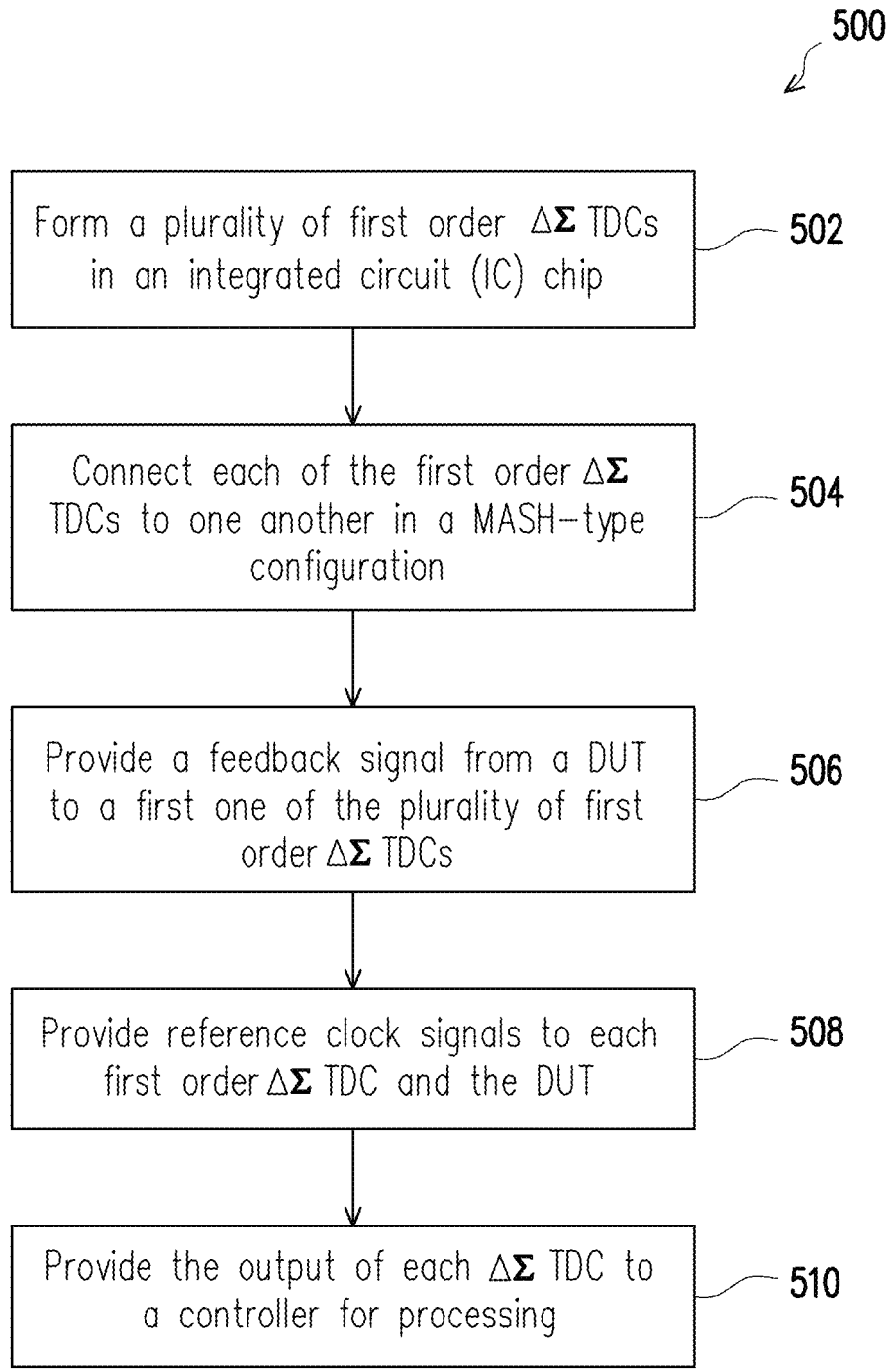
FIG. 5 illustrates a flowchart of a method of forming a high-order $\Delta\Sigma$ TDC on an integrated circuit and operating same, in accordance with some embodiments.

FIG. 5 is a flowchart of a method 500 of forming a high order ΔΣ TDC BIST circuit on a integrated circuit (IC) chip and operation of same, in accordance with some embodiments. At step 502, a plurality of first-order ΔΣ TDCs are formed on an integrated circuit (IC) chip. Next, at step 504, each of the first order ΔΣ TDCs are connected to one another in a MASH-type configuration to provide a high-order MASH type ΔΣ TDC. At step 506, a feedback signal (e.g., Fbk) is provided from a DUT (e.g., a PLL) to a first one of the plurality of ΔΣ TDCs. At step 508, a plurality of reference clock signals are provided to each of the ΔΣ TDCs and to the DUT. At step 510, the output of each of the plurality of ΔΣ TDCs is provided to a controller for processing (e.g., summing, averaging, etc.).

With respect to the method 500 of FIG. 5, in some embodiments, each of the ΔΣ TDCs includes the circuits or modules 104, 106, 108, 110, 112 and 114 as shown and configured in FIG. 1, for example. In some embodiments, the plurality of ΔΣ TDCs are connected to one another as shown and configured in FIG. 2, for example. In some embodiments, the plurality of reference clock signals are provided by the timing generator 202, as shown and configured in FIG. 2, and the plurality of reference clock signals include Fref, Fref−K×Δθ, Fref+Δθ and Fref−Δθ, as shown and applied in FIG. 2, for example. In some embodiments, the DUT is a PLL and the feedback signal has a frequency of Fbk, which is equal to an output frequency Fvco of the PLL divided by N, where N is an integer greater than 1.

Figure 6:
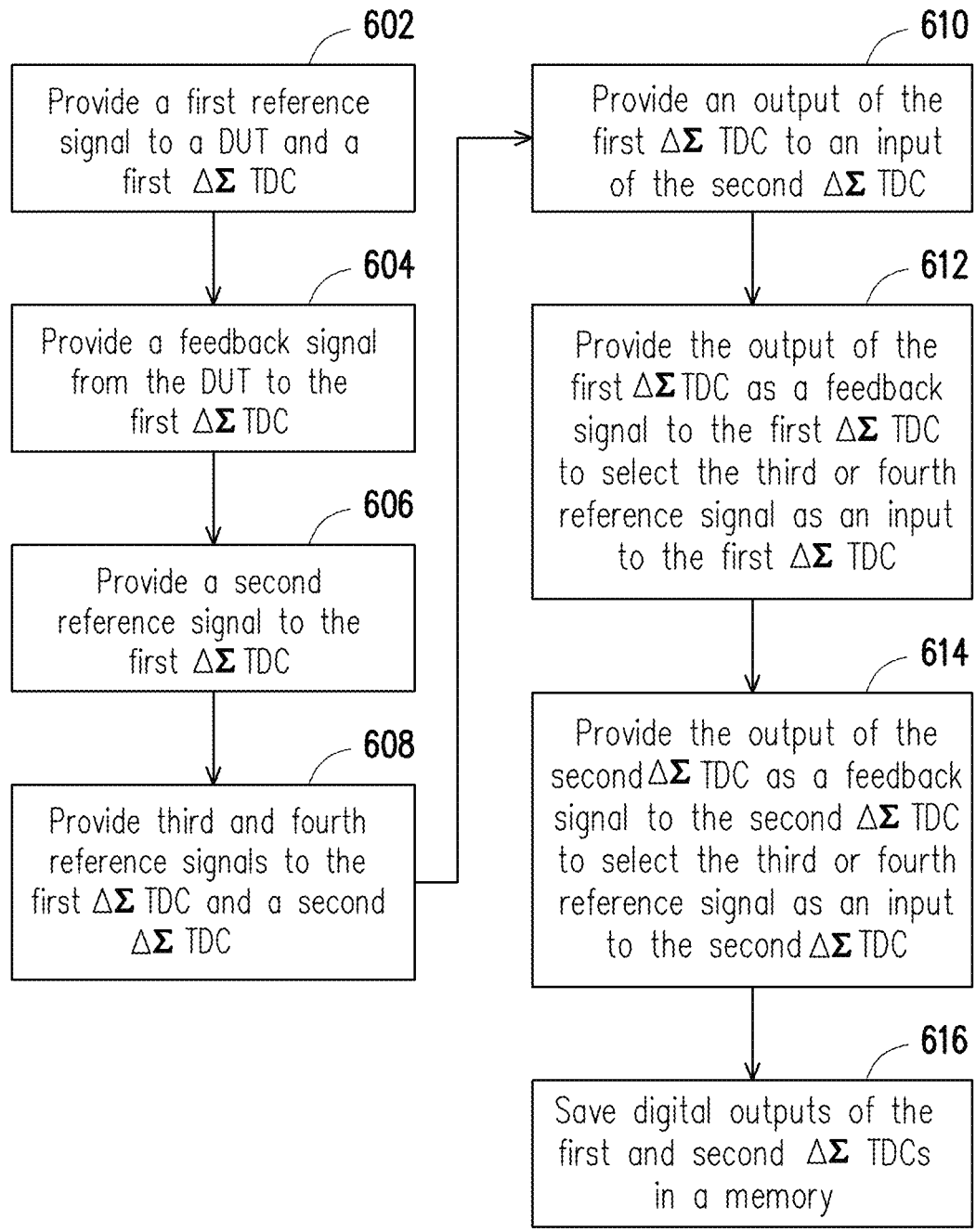
FIG. 6 illustrates a flowchart of a method of detecting PLL jitter performance information and converting it to a low-frequency digital signal, in accordance with some embodiments.

FIG. 6 illustrates a flow chart for a method of detecting PLL jitter performance information using a high-order ΔΣ TDC, in accordance with some embodiments. At step 602, a first reference signal (Fref) is provided to a device under test (DUT) and to a first ΔΣ TDC. In some embodiments, the first ΔΣ TDC includes PD 204*a*, CP 206*a*, capacitor 208*a*, VCDL 210*a*, 1-bit TDC 212*a* and multiplexer 214*a*, as shown in FIG. 2. At step 604, a feedback signal (Fbk) is provided from the DUT to the first ΔΣ TDC. At step 606, a second reference signal is provided to the first ΔΣ TDC. In some embodiments the second reference signal has the same frequency as the first reference signals but is offset in phase to lead the first reference signal by a predetermined skew value (Δθ) times K, where K is a positive integer greater than 1. In some embodiments, the second reference signal is provided to the VCDL 210a of the first ΔΣ TDC. At step 608, third and fourth reference signals are provided to the first ΔΣ TDC and a second ΔΣ TDC. In some embodiments, the second ΔΣ TDC includes PD 204b, CP 206b, capacitor 208b, VCDL 210b, 1-bit TDC 212b and multiplexer 214b, as shown in FIG. 2.

In some embodiments, the third reference signal has the same frequency as the first reference signal but leads the first reference signal by the predetermined skew value (Δθ) and the fourth reference signal has the same frequency as the first reference signal but lags the first reference signal by the predetermined skew value (Δθ). In some embodiments, the third and fourth reference signals are provided to the first multiplexer 214a having an output coupled to an input of the PD 204a, and also provided to the second multiplexer 214b having output coupled to an input of PD 204b.

At step 610, an output of the first ΔΣ TDC is provided to an input of the second ΔΣ TDC. In some embodiments, the output Fd of the first VCDL 210a is provided to an input of the second PD 204b of the second ΔΣ TDC. At step 612, the output of the first ΔΣ TDC is used as feedback signal to control selection of the third or fourth reference signal to provide as an input to the first ΔΣ TDC. Similarly, at step 614, the output of the second ΔΘ TDC is used as feedback signal to control selection of the third or fourth reference signal to provide as an input to the second ΔΣ TDC. In some embodiments, the output of the first ΔΣ TDC is provided as control signal to the first multiplexer 214a to control which of the third or fourth reference signal is provided as an input to the first PD 204a. Similarly, in some embodiments, the output of the second ΔΣ TDC is provided as control signal to the second multiplexer 214b to control which of the third or fourth reference signal is provided as an input to the second PD 204b.

At step 616, the digital outputs of the first and second ΔΣ TDC's are saved as data in a memory that represents the phase noise or jitter of the DUT. In some embodiments, the digital outputs of the first and second 1-bit TDC's 212a and 212b, respectively, are saved as data in the memory. The data may then be used to simulate the noise performance of the DUT.

Figure 7A:
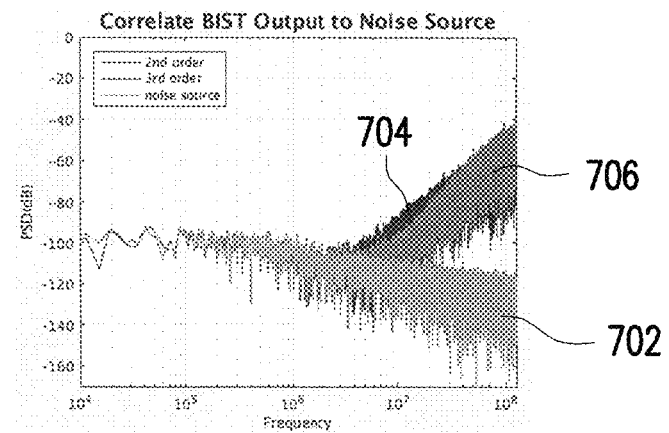
FIG. 7A-7B illustrate graphs showing noise shaping performance of $2^{nd}$ and $3^{rd}$ $\Delta\Sigma$ TDC's, in accordance with some embodiments.
Figure 7B:
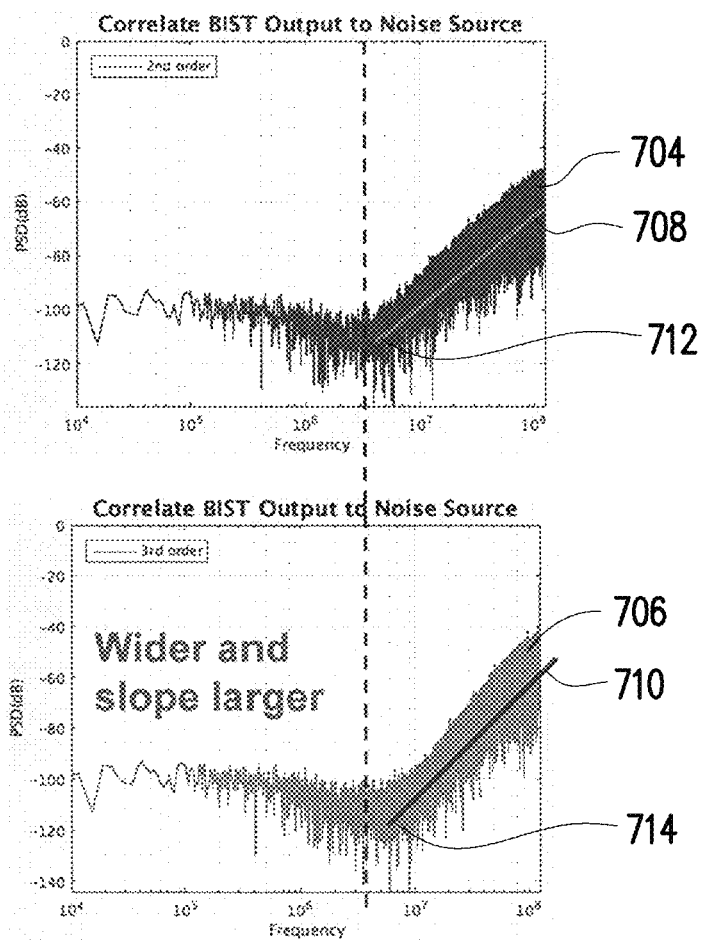

Matlab computer simulations performed on first-order, second-order and third-order ΔΣ TDCs, in accordance with embodiments of the present disclosure, reveal that the BIST result and noise source in-band noise floors are substantially the same, and that the higher order ΔΣ TDCs have superior noise shaping capabilities at higher frequencies and wider detectable bandwidths when compared to lower order ΔΣ TDCs. FIG. 7A illustrates the power spectral density (PSD) in decibels (dB) as a function of frequency for a noise source 702, an output 704 of $2^{nd}$ order ΔΣ TDC and an output 706 of $3^{rd}$ order ΔΣ TDC. As shown in FIG. 7B, the output 706 of the $3^{rd}$ order ΔΣ TDC has a steeper slope 710 than the slope 708 of the output 704 of the $2^{nd}$ order ΔΣ TDC at higher frequencies. Also, the bottom corner 714 of the output 706 of the $3^{rd}$ order ΔΣ TDC is shifted to the right compared to the bottom corner 712 of the output 704 of the $2^{nd}$ order ΔΣ TDC. These characteristics reveal that the $3^{rd}$ order ΔΣ TDC has better noise shaping capability and wider detectable bandwidth compared to the $2^{nd}$ order ΔΣ TDC.

Thus, the present disclosure provides novel and improved methods and devices for measuring phase noise of a DUT (e.g., a PLL) by providing a high order ΔΣ TDC. Since the high order ΔΣ TDC does not require a high frequency reference clock for PLL BIST measurements, it is suitable for general PLL applications. Additionally, a MASH type high order ΔΣ TDC avoids stability issues characteristic of conventional phase measurement techniques and devices, and can be easily implemented on an IC chip since each cascaded first order ΔΣ TDC has the same architecture/components and are easily connected to each other in a MASH type configuration. Thus, the layout and design of a MASH type ΔΣ TDC as BIST circuit on an IC chip can be relatively simple and efficient.

In some embodiments, an apparatus for measuring phase noise of a device under test (DUT) includes: a first phase detector configured to receive a first signal from the DUT and first clock signal from a timing generator, wherein the first phase detector is further configured to measure a phase error between the first signal and the first clock signal and output a first phase error signal; a first charge pump configured to receive the first phase error signal and generate a first current; a first capacitor configured to receive the first current and provide a first voltage; a first voltage controlled delay line (VCDL) configured to receive a second clock signal and the first voltage, and output a first delay signal indicative of a delay proportional to the first voltage; and a first 1-bit time-to-digital converter (TDC) configured to receive a third clock signal and the first delay signal and output a first logical value if the first delay signal leads the third clock signal and output a second logical value if the first delay signal lags the third clock signal.

In further embodiments, the third clock signal comprises a reference clock signal (Fref); the second clock signal comprises Fref–(K×Δθ), where K is a predetermined integer greater than one and Δθ is predetermined phase skew; and the first clock signal comprises one of Fref+Δθ or Fref–Δθ.

In some embodiments, a multi-stage noise shaping (MASH) type high-order delta sigma (ΔΣ) time-to-digital converter (TDC) includes: a first first-order ΔΣ TDC configured to receive a first signal from a device under test (DUT) and a first clock signal, wherein the first first-order ΔΣ TDC is configured to measure a phase difference between the first signal and the first clock signal and convert the phase difference to a first digital value; and a second first-order ΔΣ TDC configured to receive a first residue signal from the first first-order ΔΣ TDC and the first clock signal, wherein the second first-order ΔΣ TDC is configured to measure a phase difference between the first residue signal and the first clock signal and convert the phase difference to a second digital value.

In some embodiments, the first first-order ΔΣ TDC includes: a first phase detector configured to receive a first signal from the DUT and first clock signal from a timing generator, wherein the first phase detector is further configured to measure a phase error between the first signal and the first clock signal and output a first phase error signal; a first charge pump configured to receive the first phase error signal and generate a first current; a first capacitor configured to receive the first current and provide a first voltage; a first voltage controlled delay line (VCDL) configured to receive a second clock signal and the first voltage, and output a first delay signal indicative of a delay proportional to the first voltage; and a first 1-bit time-to-digital converter (TDC) configured to receive a third clock signal and the first delay signal and output a first logical value if the first delay signal leads the third clock signal and output a second logical value if the first delay signal lags the third clock signal. The second first-order ΔΣ TDC includes: a second phase detector configured to receive the first delay signal from the first VCDL and the first clock signal from the timing generator, wherein the second phase detector is further configured to measure a second phase error between the first delay signal and the first clock signal and output a second phase error signal; a second charge pump configured to receive the second phase error signal and generate a second current; a second capacitor configured to receive the second current and provide a second voltage; a second VCDL configured to receive the second clock signal and the second voltage, and output a second delay signal indicative of a second delay proportional to the second voltage; and a second 1-bit TDC configured to receive the third clock signal and the second delay signal and output the first logical value if the second delay signal leads the third clock signal and output the second logical value if the second delay signal lags the third clock signal.

In some embodiments, the third clock signal comprises a reference clock signal (Fref); the second clock signal comprises Fref−(K×Δθ), where K is a predetermined integer greater than one and Δθ is predetermined phase skew; and the first clock signal comprises one of Fref+Δθ or Fref−Δθ. In further embodiments, the MASH type high-order ΔΣ TDC further includes a first multiplexer having a first input configured to receive Fref+Δθ, a second input configured to receive Fref−Δθ, and a first control input configured to receive a first digital output of the first 1-bit TDC at a control input, wherein a value of the first digital output selects either Fref+AΔθ or Fref−Δθ to be output by the first multiplexer and provided to the first phase detector; and a second multiplexer having a third input configured to receive Fref+Δθ, a fourth input configured to receive Fref−Δθ, and a second control input configured to receive a second digital output of the second 1-bit TDC, wherein a value of the second digital output selects either Fref+Δθ or Fref−Δθ to be output by the second multiplexer and provided to the second phase detector.

In further embodiments, a method of forming a multi-stage noise shaping (MASH) type high-order delta sigma (ΔΣ) time-to-digital converter (TDC) includes: forming a plurality of first-order ΔΣ TDCs in an integrated circuit (IC) chip; and connecting each of the first-order ΔΣ TDCs to one another in a MASH type configuration to provide the MASH type high-order ΔΣ TDC, wherein the MASH type high-order ΔΣ TDC is configured to measure the phase noise of a device under text (DUT).

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations are used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques.

To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, module, etc. can be configured to perform one or more of the functions described herein. The term "configured to" or "configured for" as used herein with respect to a specified operation or function refers to a processor, device, component, circuit, structure, machine, module, signal, etc. that is physically constructed, programmed, arranged and/or formatted to perform the specified operation or function.

Furthermore, a person of ordinary skill in the art would understand that various illustrative logical blocks, modules, devices, components and circuits described herein can be implemented within or performed by an integrated circuit (IC) that can include a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A processor programmed to perform the functions herein will become a specially programmed, or special-purpose processor, and can be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the present disclosure.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. An apparatus for measuring phase noise of a device under test (DUT), the apparatus comprising:
    a first phase detector configured to receive a first signal from the DUT and first clock signal from a timing generator, wherein the first phase detector is further configured to measure a phase error between the first signal and the first clock signal and output a first phase error signal;
    a first charge pump configured to receive the first phase error signal and generate a first current;
    a first capacitor configured to receive the first current and provide a first voltage;
    a first voltage controlled delay line (VCDL) configured to receive a second clock signal and the first voltage, and output a first delay signal indicative of a delay proportional to the first voltage; and
    a first 1-bit time-to-digital converter (TDC) configured to receive a third clock signal and the first delay signal and output a first logical value if the first delay signal leads the third clock signal and output a second logical value if the first delay signal lags the third clock signal.

2. The apparatus of claim 1 further comprising:
    a second phase detector configured to receive the first delay signal from the first VCDL and the first clock signal from the timing generator, wherein the second phase detector is further configured to measure a second phase error between the first delay signal and the first clock signal and output a second phase error signal;
    a second charge pump configured to receive the second phase error signal and generate a second current;
    a second capacitor configured to receive the second current and provide a second voltage;
    a second VCDL configured to receive the second clock signal and the second voltage, and output a second delay signal indicative of a second delay proportional to the second voltage; and
    a second 1-bit TDC configured to receive the third clock signal and the second delay signal and output the first logical value if the second delay signal leads the third clock signal and output the second logical value if the second delay signal lags the third clock signal.

3. The apparatus of claim 2 further comprising:
    a third phase detector configured to receive the second delay signal from the second VCDL and the first clock signal from the timing generator, wherein the third phase detector is further configured to measure a third phase error between the second delay signal and the first clock signal and output a third phase error signal;
    a third charge pump configured to receive the third phase error signal and generate a third current;
    a third capacitor configured to receive the third current and provide a third voltage;
    a third VCDL configured to receive the second clock signal and the third voltage, and output a third delay signal indicative of a third delay proportional to the third voltage; and
    a third 1-bit TDC configured to receive the third clock signal and the third delay signal and output the first logical value if the third delay signal leads the third clock signal and output the second logical value if the third delay signal lags the third clock signal.

4. The apparatus of claim 3 wherein:
    the third clock signal comprises a reference clock signal (Fref);
    the second clock signal comprises Fref$-(K \times \Delta\theta)$, where K is a predetermined integer greater than one and $\Delta\theta$ is predetermined phase skew; and
    the first clock signal comprises one of Fref$+\Delta\theta$ or Fref$-\Delta\theta$.

5. The apparatus of claim 4 further comprising:
    a first multiplexer having a first input configured to receive Fref$+\Delta\theta$, a second input configured to receive Fref$-\Delta\theta$, and a first control input configured to receive a first digital output of the first 1-bit TDC at a control input, wherein a value of the first digital output selects either Fref$+\Delta\theta$ or Fref$-\Delta\theta$ to be output by the first multiplexer and provided to the first phase detector;
    a second multiplexer having a third input configured to receive Fref$+\Delta\theta$, a fourth input configured to receive Fref$-\Delta\theta$, and a second control input configured to receive a second digital output of the second 1-bit TDC, wherein a value of the second digital output selects either Fref$+\Delta\theta$ or Fref$-\Delta\theta$ to be output by the second multiplexer and provided to the second phase detector; and
    a third multiplexer having a fifth input configured to receive Fref$+\Delta\theta$, a sixth input configured to receive Fref$-\Delta\theta$, and a third control input configured to receive a third digital output of the third 1-bit TDC, wherein a value of the third digital output selects either Fref$+\Delta\theta$ or Fref$-\Delta\theta$ to be output by the third multiplexer and provided to the third phase detector.

6. The apparatus of claim 4 further comprising a timing generator configured to generate the first, second and third clock signals.

7. The apparatus of claim 3 wherein the DUT comprises a phase locked loop (PLL) and the first signal comprises a feedback signal of the PLL having a frequency equal to an output frequency of the PLL divided by N, where N is a predetermined integer greater than 1.

8. The apparatus of claim 1 wherein:
    the third clock signal comprises a reference clock signal (Fref);
    the second clock signal comprises Fref$-(K \times \Delta\theta)$, where K is a predetermined integer greater than one and $\Delta\theta$ is predetermined phase skew; and
    the first clock signal comprises one of Fref$+\Delta\theta$ or Fref$-\Delta\theta$.

9. The apparatus of claim 8 further comprising:
a first multiplexer having a first input configured to receive Fref+Δθ, a second input configured to receive Fref−Δθ, and a first control input configured to receive a first digital output of the first 1-bit TDC at a control input, wherein a value of the first digital output selects either Fref+Δθ or Fref−Δθ to be output by the first multiplexer and provided to the first phase detector.

10. The apparatus of claim 8 further comprising a timing generator configured to generate the first, second and third clock signals.

11. A multi-stage noise shaping (MASH) type high-order delta sigma (ΔΣ) time-to-digital converter (TDC), comprising:
a first first-order ΔΣ TDC configured to receive a first signal from a device under test (DUT) and a first clock signal, wherein the first first-order ΔΣ TDC is configured to measure a phase difference between the first signal and the first clock signal and convert the phase difference to a first digital value; and
a second first-order ΔΣ TDC configured to receive a first residue signal from the first first-order ΔΣ TDC and the first clock signal, wherein the second first-order ΔΣ TDC is configured to measure a phase difference between the first residue signal and the first clock signal and convert the phase difference to a second digital value.

12. The MASH type high-order ΔΣ TDC of claim 11, wherein the first first-order ΔΣ TDC comprises:
a first phase detector configured to receive a first signal from the DUT and first clock signal from a timing generator, wherein the first phase detector is further configured to measure a phase error between the first signal and the first clock signal and output a first phase error signal;
a first charge pump configured to receive the first phase error signal and generate a first current;
a first capacitor configured to receive the first current and provide a first voltage;
a first voltage controlled delay line (VCDL) configured to receive a second clock signal and the first voltage, and output a first delay signal indicative of a delay proportional to the first voltage; and
a first 1-bit time-to-digital converter (TDC) configured to receive a third clock signal and the first delay signal and output a first logical value if the first delay signal leads the third clock signal and output a second logical value if the first delay signal lags the third clock signal.

13. The MASH type high-order ΔΣ TDC of claim 12, wherein the second first-order ΔΣ TDC comprises:
a second phase detector configured to receive the first delay signal from the first VCDL and the first clock signal from the timing generator, wherein the second phase detector is further configured to measure a second phase error between the first delay signal and the first clock signal and output a second phase error signal;
a second charge pump configured to receive the second phase error signal and generate a second current;
a second capacitor configured to receive the second current and provide a second voltage;
a second VCDL configured to receive the second clock signal and the second voltage, and output a second delay signal indicative of a second delay proportional to the second voltage; and
a second 1-bit TDC configured to receive the third clock signal and the second delay signal and output the first logical value if the second delay signal leads the third clock signal and output the second logical value if the second delay signal lags the third clock signal.

14. The MASH type high-order ΔΣ TDC of claim 13, wherein:
the third clock signal comprises a reference clock signal (Fref);
the second clock signal comprises Fref−(K×Δθ), where K is a predetermined integer greater than one and Δθ is predetermined phase skew; and
the first clock signal comprises one of Fref+Δθ or Fref−Δθ.

15. The MASH type high-order ΔΣ TDC of claim 14, further comprising:
a first multiplexer having a first input configured to receive Fref+Δθ, a second input configured to receive Fref−Δθ, and a first control input configured to receive a first digital output of the first 1-bit TDC at a control input, wherein a value of the first digital output selects either Fref+Δθ or Fref−Δθ to be output by the first multiplexer and provided to the first phase detector; and
a second multiplexer having a third input configured to receive Fref+Δθ, a fourth input configured to receive Fref−Δθ, and a second control input configured to receive a second digital output of the second 1-bit TDC, wherein a value of the second digital output selects either Fref+Δθ or Fref−Δθ to be output by the second multiplexer and provided to the second phase detector.

16. The MASH type high-order ΔΣ TDC of claim 14, further comprising a timing generator configured to generate the first, second and third clock signals.

17. The MASH type high-order ΔΣ TDC of claim 13, wherein the DUT comprises a phase locked loop (PLL) and the first signal comprises a feedback signal of the PLL having a frequency equal to an output frequency of the PLL divided by N, where N is a predetermined integer greater than 1.

18. A method of converting noise into a digital signal, the method comprising:
providing a first reference signal to a device under test (DUT) and a first node of a first delta sigma (ΔΣ) time-to-digital converter (TDC);
providing a first feedback signal from the DUT to a second node of the first ΔΣ TDC;
providing a second reference signal to a third node of the first ΔΣ TDC;
providing a third and a fourth reference signal to a fourth and a fifth node, respectively, of the first ΔΣ TDC;
providing a first output of the first ΔΣ TDC as a second feedback signal to a sixth node of the first ΔΣ TDC, wherein the second feedback signal selects either the third or fourth reference signal to provide to a seventh node of the first ΔΣ TDC; and
saving a digital output of the first ΔΣ TDC in a memory.

19. The method of claim 18 further comprising:
providing the first reference signal to a first node of a second ΔΣ TDC;
providing the second reference to a second node of the second ΔΣ TDC;
providing the third and fourth reference signals to a third node and a fourth node, respectively, of the second ΔΣ TDC;
providing a second output of the first ΔΣ TDC to a fifth node of a second ΔΣ TDC;
providing a first output of the second ΔΣ TDC as a third feedback signal to a sixth node of the second ΔΣ TDC, wherein the third feedback signal selects either the third or fourth reference signal to provide to a seventh node of the second ΔΣ TDC; and saving a digital output of the second ΔΣ TDC in a memory.

20. The method of claim 19 wherein each of the first and second ΔΣ TDCs is configured to provide a digital output signal to a controller for processing, wherein the digital output signal is representative of a phase noise of the DUT.

* * * * *